United States Patent [19]
Hamrah et al.

[11] Patent Number: 5,242,538
[45] Date of Patent: Sep. 7, 1993

[54] REACTIVE ION ETCH PROCESS INCLUDING HYDROGEN RADICALS

[75] Inventors: Matt M. Hamrah, Austin, Tex.; Graham W. Hills, Los Gatos; Ian J. Morey, San Jose, both of Calif.

[73] Assignee: Applied Materials, Inc., Santa Clara, Calif.

[21] Appl. No.: 827,377

[22] Filed: Jan. 29, 1992

[51] Int. Cl.$^5$ .................. B44C 1/22; C03C 15/00; C03C 25/06
[52] U.S. Cl. .................. 156/643; 156/657; 156/659.1; 156/345; 252/79.1
[58] Field of Search .............. 252/79.1; 156/643, 646, 156/653, 657, 659.1, 662, 345; 204/192.32, 192.37; 437/233, 238; 427/38, 39

[56] References Cited

U.S. PATENT DOCUMENTS

| | | | |
|---|---|---|---|
| 4,283,249 | 8/1981 | Ephrath | 156/643 |
| 4,324,611 | 4/1982 | Vogel et al. | 156/643 |
| 4,668,338 | 5/1987 | Maydan et al. | 156/643 |
| 4,687,543 | 8/1987 | Bowker | 156/643 |
| 4,734,157 | 3/1988 | Carbaugh et al. | 156/643 |
| 4,857,140 | 8/1989 | Loewenstein | 156/643 |
| 5,021,121 | 6/1991 | Groechel et al. | 156/643 |

Primary Examiner—William A. Powell
Attorney, Agent, or Firm—Willis E. Higgins

[57] ABSTRACT

The addition of a gaseous source of hydrogen radicals, such as hydrogen, ammonia or methane to oxide RIE etching chemistries, in amounts of from about 5 to about 20 percent by volume of the total gas flow, will increase the oxide etch rate while suppressing the polysilicon etch rate. This effect is more pronounced at lower wafer temperatures. This new process chemistry increases the oxide etch rate to greater than 5000 Å/min., improves the selectivity to polysilicon to greater than 25:1 and improves the selectivity to photoresist to greater than 6:1, without having a significant detrimental effect on the profile angle, the RIE lag and the etch rate uniformity. Selectivities of 50:1 have been achieved with less than 15% RIE lag using the chemistry $CHF_3$, Ar, $CF_4$ and $NH_3$, with $NH_3$ constituting 10 percent by volume of the gas flow.

29 Claims, 3 Drawing Sheets

REACTIVE ION ETCH PROCESS INCLUDING HYDROGEN RADICALS

BACKGROUND OF THE INVENTION

1. Field of the Invention:

The present invention relates generally to a process for etching dielectric layers in the fabrication of semiconductor devices. More particularly, it relates to such a process for etching oxides. Most especially, it relates to such a process for contact etching, particularly in high aspect ratio geometries.

2. Description of the Prior Art:

Reactive ion etch (RIE) processes for etching oxide layers are well known in the art and have achieved wide acceptance in the semiconductor industry. For example, apparatus for carrying out such processes is described in commonly assigned U.S. Pat. No. 4,842,683, issued Jun. 27, 1989 to Cheng et al. and U.S. Pat. No. 4,668,338, issued May 26, 1987 to Maydan et al. Apparatus for carrying out such processes is commercially available from Applied Materials, Santa Clara, Calif., under the designation Precision 5000E and 8300. Currently, gas mixtures used for etching oxide in the Precision 5000E apparatus include mixtures of $CHF_3$ and $O_2$; $CHF_3$, Ar and $O_2$; $CHF_3$, Ar and $CF_4$; $CHF_3$, He, and $CF_4$ and $CHF_3$, Ar and $C_2F_6$. These chemistries can achieve high etch rates and high selectivities, but oxide to polysilicon selectivities of greater than 25:1 cannot be achieved without an increase in the RIE lag to greater than 15 percent. The term "RIE lag" refers to the percentage difference in the oxide etch depth of 1 micron ($\mu$) wide contacts compared with the oxide etch depth of 0.5 $\mu$ wide contacts under the same process conditions.

In detailed studies of the standard oxide etch chemistry of $CHF_3$, Ar and $CF_4$ and standard 5000E apparatus for a high aspect ratio contact etch, it was determined that there would be difficulty meeting the following specification:

| | |
|---|---|
| RIE Lag | <10% in 0.5 $\mu$m contacts compared with 1.0 $\mu$m contacts at 2.0 $\mu$m depth. |
| Etch Rate | >4000 Å/min, undoped oxide |
| Uniformity | <10% 3$\sigma$, 6 mm edge exclusion |
| Selectivity | >30:1 to doped polysilicon |
| Profile | >85 degrees. |

It was found that there is always a compromise between lag and selectivity. The etch rate, uniformity and profile specifications can be achieved over a large process window, but it is hard to achieve a selectivity greater than 20:1 with a lag of less than 10%. This is also true for cathode temperatures as low as $-40°$ C. At such lower cathode temperatures, the process window is reduced further because the profile angle is worse due to increased polymer deposition.

SUMMARY OF THE INVENTION

The addition of a gaseous source of hydrogen (H and/or $H_2$) radicals, such as hydrogen, ammonia or methane to oxide RIE etching chemistries, desirably in amounts of from about 5 to about 20 percent by volume of the total gas flow, will increase the oxide etch rate while suppressing the polysilicon etch rate. This effect is more pronounced at lower wafer temperatures. Preferred embodiments of this new process chemistry increases the oxide etch rate to greater than 5000 Å/min., improves the selectivity to polysilicon to greater than 25:1 and improves the selectivity to photoresist to greater than 6:1, without having a significant detrimental effect on the profile angle, the RIE lag and the etch rate uniformity. Selectivities of 50:1 have been achieved with less than 15% RIE lag using the chemistry $CHF_3$, Ar, $CF_4$ and $NH_3$, with $NH_3$ constituting 10 percent by volume of the gas flow. For purposes of this invention, the term "reactive ion etch" refers to plasma etching processes which have a DC bias on a substrate holder, thus giving ion bombardment on the substrate.

A reactive ion etch process in accordance with this invention includes positioning a structure comprising at least one of a dielectric layer and a semiconductor layer on a surface of a substrate in a closed chamber. A selected reactive gas mixture including a gaseous source of hydrogen radicals is supplied to the chamber. RF energy is supplied to the chamber to establish an etching plasma and an associated electric field substantially perpendicular to the surface of the substrate. The reactive gas mixture is allowed to etch at least a portion of the dielectric or semiconductor layer.

The attainment of the foregoing and related advantages and features of the invention should be more readily apparent to those skilled in the art, after review of the following more detailed description of the invention, taken together with the drawings, in which:

DETAILED DESCRIPTION OF THE INVENTION

Figure 1:
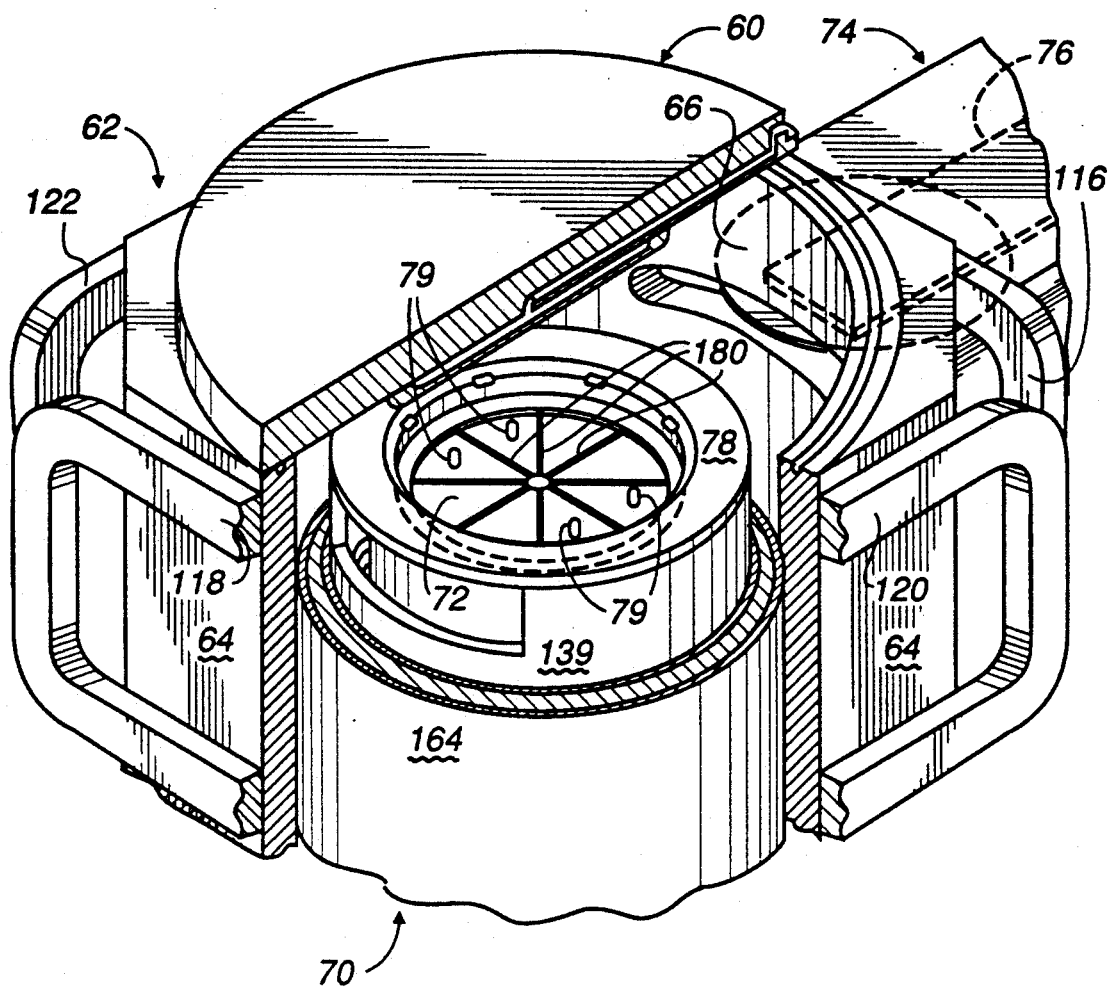
FIG. 1 is a perspective view of a plasma etching system suitable for practice of the invention.
Figure 2:
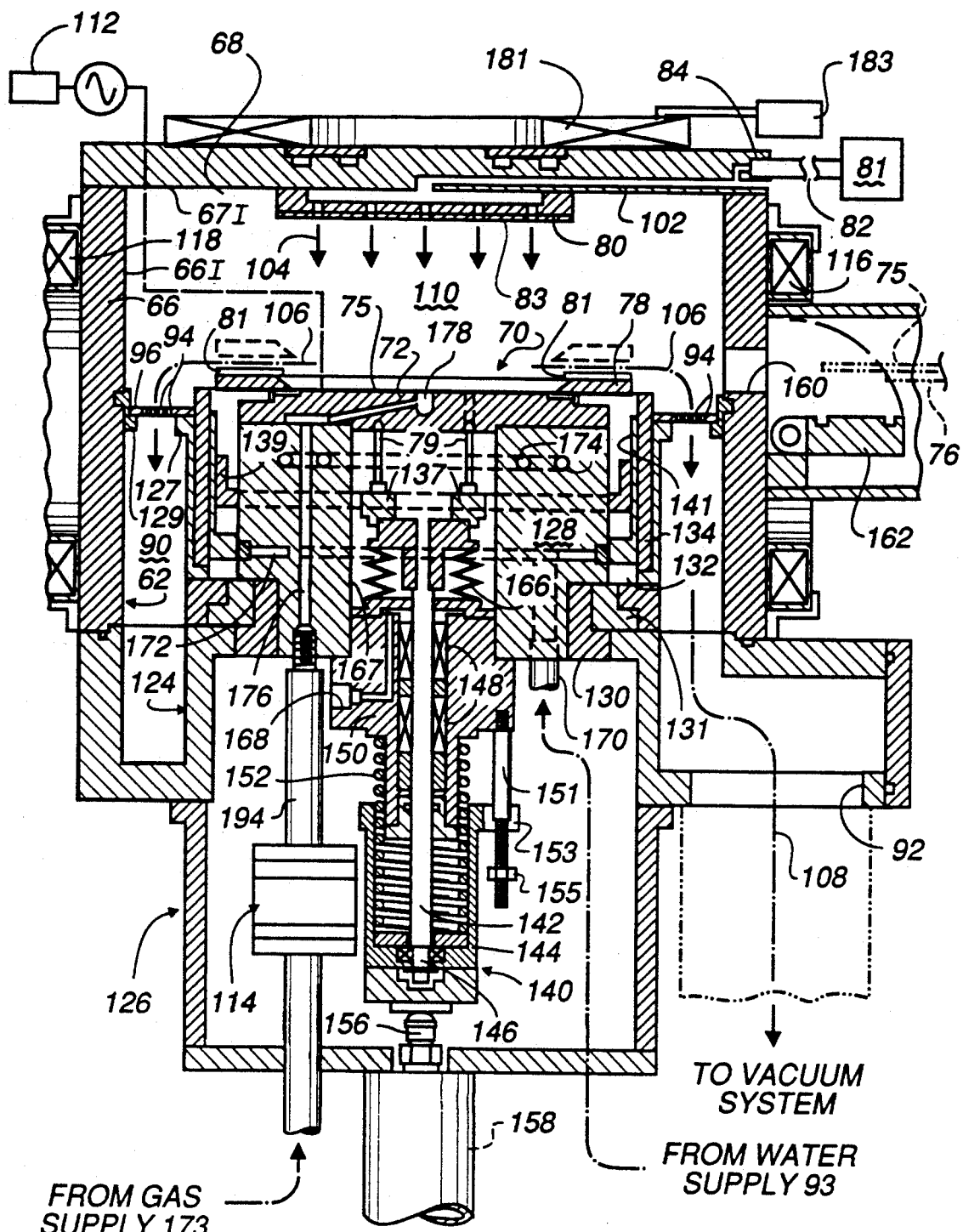
FIG. 2 is a cross section view of the plasma etching system of FIG. 1.

Turning now to the drawings, more particularly to FIGS. 1 and 2, there is shown an RIE mode plasma etching system 60 which can be used to practice the process of the present invention. The system 60 includes a housing 62, typically of non-magnetic material, such as aluminum, which has an octagonal configuration of outer walls 64. Circular inner wall 66 defines etch chamber 68. The reactor system 60 also includes a unique gas- and liquid-cooled pedestal/cathode assembly 70 and a wafer exchange system 74.

The wafer exchange system 74 includes vertically movable wafer lift fingers 79 which pick up a wafer 75 from an external manually held or operated blade 76 which is inserted into the chamber or, preferably, from an external load lock robot blade 76, and transfer the wafer to the cathode 72 for processing, then return the processed wafer to the robot blade for removal from the chamber.

In addition, the wafer exchange system 74 integrally incorporates a wafer clamp ring 78 with wafer lift fingers 79. The design of the wafer exchange system 74 and the incorporation of the associated wafer lift and clamping structures permit the use of a one-axis robotic drive within the chamber. Furthermore, the operation of the chamber robot requires that the external robot merely present the wafer to a selected transfer position for exchange with the chamber robot. Simplifying the demands on the external robot makes possible a relatively simple robot, even when the robot is used in a multi-chamber load lock system that serves a multiplicity of reactors.

Process gases are supplied to the interior of the chamber 68 by a gas manifold 80 from a gas supply system 81 comprising one or more gas storage reservoir/tanks. The gas supply system 81 communicates to the manifold 80 and chamber 68 via supply line(s) 82, which is coupled into the manifold 80 by inlet connection 84. The system includes an automatic flow control system or other suitable control system which controls the flow rates of the various etchant gases, carrier gases, and the like, supplied to the chamber 68.

Vacuum is supplied to the chamber and spent gases and entrained products are exhausted via annular exhaust chamber 90 communicating to exhaust port 92, which, in turn, is connected to a conventional vacuum pumping system 93. The exhaust flow is directed from the chamber 68 through holes 94 in a horizontal annular plate 96 mounted about the upper periphery of the cylindrical cathode assembly 70. The apertured plate 96 inhibits plasma penetration into the annular exhaust chamber 90. This exhaust arrangement facilitates uniform coverage and etching of wafer 75 by the reactant gas. Control of the exhaust system can be by a capacitive conventional system, such as a manometer sensor (not shown), which operates through a pressure control system and D.C. motor to control the speed of the blower, or by other conventional control systems.

As indicated by the arrows 102, 104, 106, 108 in FIG. 2, the gas communicated by inlet 84 (arrow 100) is routed into the manifold 80 (arrow 102) and is then directed downwardly from the manifold (arrow 104), forming an etching gas plasma in chamber process region 110 during application of RF power, then flows over the wafer 75 and radially outwardly across the wafer and into the annular exhaust chamber (arrow 106), then out the exhaust port 92 (arrow 108).

The above-mentioned RF power is supplied by an RF supply system 112 to the reactor system 60 for plasma operation, i.e., to create an etching gas plasma from the inlet gases in process region 110. This system 112 includes an RF power supply and a load matching network, and is connected to the pedestal 72, with the chamber walls being at ground. That is, the pedestal is the powered cathode. The RF power typically is supplied at a high frequency, preferably about 13.6 MHz. However, the reactor system 60 can be operated at low frequencies of, for example, several KHz.

The use of a powered pedestal cathode 72 has the advantage of concentrating the RF power and plasma on the surface area of the wafer and increasing the power density across the wafer while reducing it everywhere else. This ensures that etching takes place on the wafer only, reducing erosion in other parts of the chamber, and thus reducing possible wafer contamination. Typically, power densities of about 2.5–3.5 watts/cm$^2$ are and can be used. These high power densities require cooling. Preferably, the RF-powered cathode 72 is constructed to combine gas-enhanced wafer-to-cathode thermal conductance and liquid cathode cooling. However, the application of cooling gas, such as helium, to the powered pedestal 72 at low pressure would ordinarily cause the cooling gas to break down. The reactor system 60 includes a unique gas feed-through 114 that supplies the gas to the high voltage electrode without ionization. A control system and power supplies (not shown) are connected to the coils 116, 118, 120 and 122 for independently controlling direction and magnitude of the DC magnetic field. Further details on the construction and operation of the system 60 are provided in the above referenced Cheng et al., U.S. Pat. No. 4,842,683, the disclosure of which is incorporated by reference herein. Alternatively, an RIE mode plasma etching system as described in the above-referenced Maydan et al., U.S. Pat. No. 4,668,338, could be employed, the disclosure of which is also incorporated by reference herein.

Standard system configurations used for REI etching of oxides, such as systems incorporating electron cyclotron resonance (ECR) and inductive and capacitive RF sources and the like are operable with the process of this invention. Suitable gaseous sources of hydrogen radicals include hydrogen gas, which is preferably supplied in admixture with an inert carrier gas, such as helium or argon, desirably in an amount of about 10 volume percent hydrogen gas, balance inert carrier gas, ammonia and methane. The preferred gaseous source of hydrogen radicals is ammonia.

The following table shows suitable ranges and optimum values for 5 inch silicon wafers for use of the invention with a preferred reaction chemistry:

| Variable | Range | Optimum, 5" Wafers |
|---|---|---|
| CHF$_3$ | 10–100 scc/m | 30 |
| Ar | 50–200 scc/m | 60 |
| CF$_4$ | 3–20 scc/m | 3 |
| Pressure | 5–500 mT. | 200 |
| Power | 400–1200 watts | 600 |
| B field | 0–120 gauss | 25 |
| Temperature | 0–20° C. - standard refrigeration | |
| | −40–20° C. - with special refrigeration | |

The following non-limiting examples represent best modes contemplated by the inventors for practicing the invention and describe the invention further.

EXAMPLE 1

Different reaction gas chemistries were investigated in the 5000E system to find a process which would provide higher selectivity without increasing the RIE lag. The chemistries studied were:
1. CHF$_3$, Ar and SF$_6$;
2. CHF$_3$, Ar and C$_2$F$_6$ and
3. CHF$_3$, Ar, CF$_4$ and NH$_3$ The following reaction conditions were used: 30 sccm CHF$_3$/60 sccm Ar/3 sccm SF$_6$/0 sccm NH$_3$/200 mT/600 W/25 G/20° C.; 30 sccm CHF$_3$/60 sccm Ar/3 sccm C$_2$F$_6$/0 sccm NH$_3$/200 mT/600 W/25 G/20° C.; 30 sccm CHF$_3$/60 sccm Ar/3 sccm CF$_4$/10 sccm NH$_3$/200 mT/600 W/25 G/20° C.

Swapping CF$_4$ for SF$_6$ reduced the selectivity by about a factor of two using the same CF$_4$ and SF$_6$ flow, and so this chemistry was rejected. Swapping CF$_4$ for C$_2$F$_6$ had little effect on the etch rates and selectivity with the same CF$_4$ and C$_2$F$_6$ flow. Changing the Ar:CHF$_3$ gas flow ratio and pressure still did not show any significant difference between the CHF$_3$, Ar and C$_2$F$_6$ and CHF$_3$, Ar and CF$_4$ chemistries, and so the C$_2$F$_6$ chemistry was not examined any further. However, the addition of NH$_3$ to the CHF$_3$, Ar and CF$_4$ chemistry was found to have significant benefits, especially at low cathode temperatures. Similar results should be obtained with the addition of NH$_3$ to the other two chemistries. The addition of NH$_3$ increases the profile angle, and can increase the selectivity without increasing the lag. The following specifications are achievable:

| | |
|---|---|
| RIE Lag | <14% in 0.5 μm contacts at 2.0 μm depth. |
| Etch Rate | >3000 Å/min, undoped oxide. |
| Uniformity | <12% 3σ, 6 mm edge exclusion. |
| Selectivity | >30:1 to doped polysilicon. |
| Profile | >85 degrees. |

Significant polymer deposition is observed, which may present a particle problem.

EXAMPLE 2

Further study of NH$_3$ addition was carried out, by adding NH$_3$ to the reactant gas in a commercial process using the following conditions:
30 sccm CHF$_3$/60 sccm Ar/3 sccm CF$_4$/0 sccm NH$_3$/200 mT/600 W/25 G/20° C.
The experiment examined the effects of CF$_4$ and NH$_3$ flow, as well as the cathode temperature. The experiment included runs with a 5° C. cathode temperature to allow operation of the 5000E system with standard hardware. The parameter space studied is as follows:

| Factor | Low | Center | High |
|---|---|---|---|
| CHF$_3$: | | 30 scc/m | |
| Ar: | | 60 scc/m | |
| CF$_4$ | 3 scc/m | | 9 scc/m |
| NH$_3$ | 0 scc/m | | 10 scc/m |
| Pressure | | 200 mTorr | |
| Power | | 600 Watt | |
| B Field | | 25 gauss | |
| Cathode Temp: | −35° C. | | 20° C. |

Figure 3:
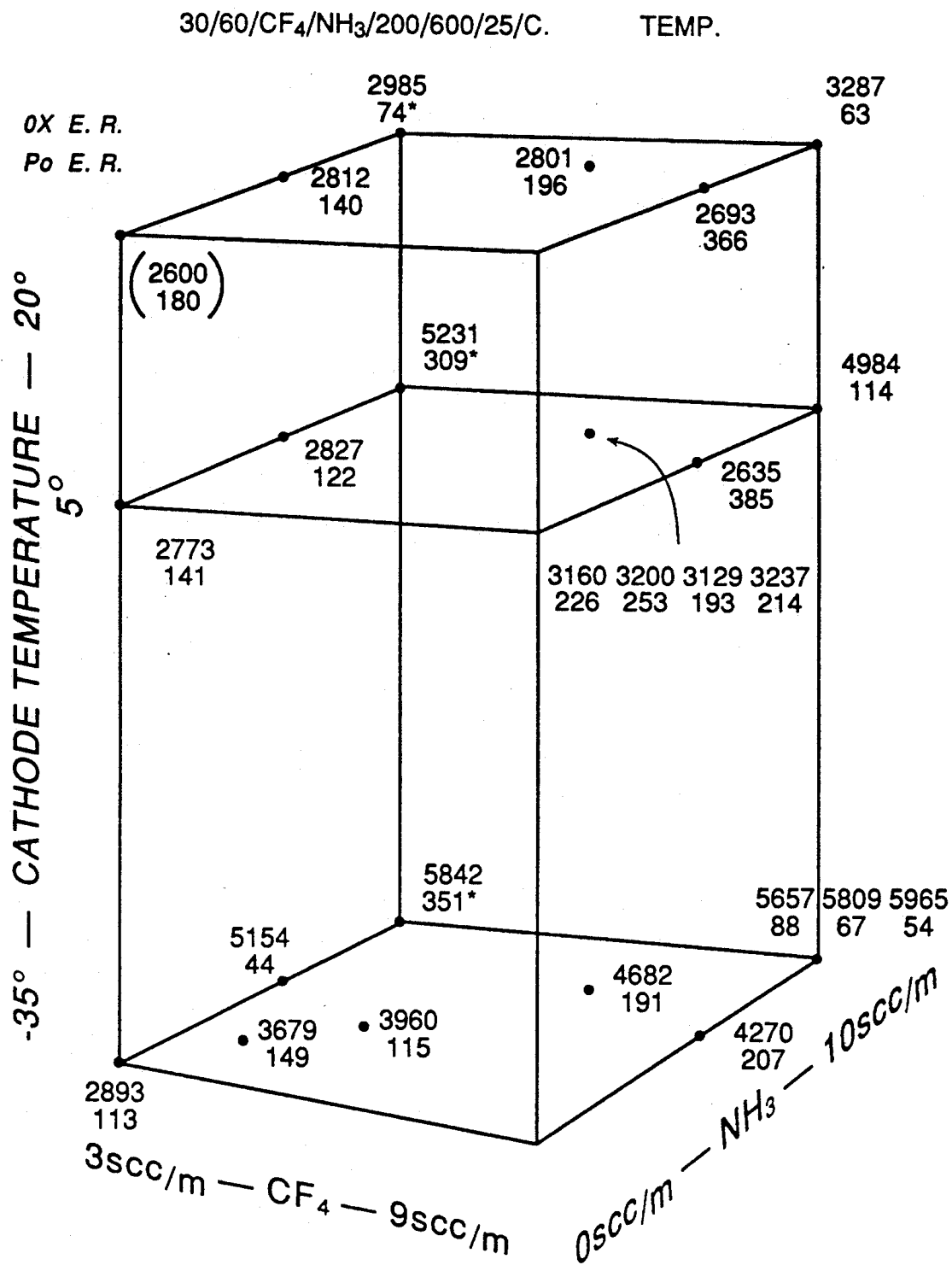
FIG. 3 is a graph of results obtained with practice of a reactive ion etch process in accordance with the invention.

The results are shown in FIG. 3. To summarize the results, when 10 scc/m of NH$_3$ is used, the oxide etch rate increases by up to 100% when the cathode temperature is reduced from 20° C. to −35° C. If no NH$_3$ is added, the oxide etch rate increases by 10%, at most, with the same change in cathode temperature. The polysilicon etch rate is controlled by the ratio of CF$_4$ and NH$_3$ flows. With the CF$_4$ flow higher than the NH$_3$ flow the polysilicon etch rate is high, but with NH$_3$ flow higher than the CF$_4$ flow the polysilicon etch rate is lower. However, in the latter case, a thick layer of polymer can be deposited, which can affect the Nanospec interferometer readings of polysilicon thickness. Selectivities of up to 100:1 have been achieved with 10 scc/m of NH$_3$ and −35° C. cathode temperature.

A number of runs were also made with lower pressure and higher Ar:CHF$_3$ flow ratios. The following three runs had polysilicon etch rates of about 2500 Å/min:

| Process | units | 1 | 2 | 3 |
|---|---|---|---|---|
| CHF$_3$ | scc/m | 10 | 10 | 30 |
| Ar | scc/m | 80 | 80 | 60 |
| CF$_4$ | scc/m | 3 | 9 | 9 |
| NH$_3$ | scc/m | 10 | 10 | 10 |
| Pressure | mTorr | 200 | 200 | 70 |
| Power | Watts | 600 | 600 | 600 |
| B Field | gauss | 25 | 25 | 25 |
| Cathode Temp | Celsius | 20 | 20 | 20 |

EXAMPLE 3

Based on Example 2, it was decided to conduct a screening experiment to determine the most important factors affecting the oxide and polysilicon etch rates. The experiment used an L8 Taguchi screening design with one center point and the following levels:

| Factor | units | low | center | high |
|---|---|---|---|---|
| Ar:CHF$_3$ Ratio | scc/m:scc/m | 2 | 3 | 4 |
| CF$_4$ | scc/m | 3 | 6 | 9 |
| NH$_3$ | scc/m | 4 | 7 | 10 |
| Pressure | mTorr | 150 | 200 | 250 |
| Power | Watts | 600 | 700 | 800 |
| B Field | gauss | 25 | 50 | 75 |
| Cathode Temp | Celsius | −35 | −7.5 | 20 |

The results are shown in the following table:

| Process # | Units | 1 | 2 | 3 | 4 | 5 | 6 | 7 | 8 | 9 |
|---|---|---|---|---|---|---|---|---|---|---|
| CHF$_3$ | sccm | 30 | 18 | 30 | 18 | 30 | 18 | 30 | 18 | 23 |
| Ar | sccm | 60 | 72 | 60 | 72 | 60 | 72 | 60 | 72 | 67 |
| CF$_4$ | sccm | 3 | 3 | 9 | 9 | 3 | 3 | 9 | 9 | 6 |
| NH$_3$ | sccm | 4 | 4 | 4 | 4 | 10 | 10 | 10 | 10 | 7 |
| Pressure | mTorr | 150 | 250 | 250 | 150 | 250 | 150 | 150 | 250 | 200 |
| Power | Watts | 800 | 600 | 600 | 800 | 800 | 600 | 600 | 800 | 700 |
| B Field | gauss | 75 | 25 | 75 | 25 | 25 | 75 | 25 | 75 | 50 |
| Temperature | °C. | 20 | 20 | −35 | −35 | −35 | −35 | 20 | 20 | −7.5 |
| Ox Time | sec. | 60 | 60 | 60 | 60 | 60 | 60 | 60 | 60 | 60 |
| Poly Time | sec. | 120 | 120 | 120 | 120 | 120 | 120 | 120 | 120 | 120 |
| Thermal Oxide | Å/min. | 5093 | 2667 | 4111 | 4234 | 6128 | 8447 | 3398 | 5242 | 4559 |
| Oxide Uniformity | max./min 2 × mean | 4.6 | 4.9 | 2.9 | 4.8 | 5.4 | 6.0 | 2.4 | 4.8 | 4.3 |
| Polysilicon | Å/min. | 299 | 231 | 517 | 565 | 83 | 4804 | 218 | 643 | 284 |
| Polysilicon Uniformity | max./min 2 × mean | 14.9 | 6.2 | 4.9 | 16.8 | 13.0 | 83.2 | 5.0 | 5.1 | 38.3 |

Analysis of the data shows that NH$_3$ flow, cathode temperature, B field and CF$_4$ flow are the most important factors controlling the oxide etch rate. This agrees with the results of Example 1 except for the effect of CF$_4$ flow. Decreasing oxide etch rate with increasing CF$_4$ flow is also contrary to the behavior of CHF$_3$/Ar/CF$_4$ chemistry. Similarly, power is one of the least important factors affecting etch rate with the addition of NH$_3$, quite different from the behavior of CHF$_3$/Ar/CF$_4$ chemistry. The results confirm that the addition of NH$_3$ to the CHF$_3$/Ar/CF$_4$ chemistry can either decrease or significantly increase the polysilicon etch rate. The sensitivity of the polysilicon etch rate with different Ar:CHF$_3$ flow ratios and pressures is much less without NH$_3$ in the gas mixture.

EXAMPLE 4

A screening experiment was designed to determine the effect of NH$_3$ addition on RIE lag and profile angle in a limited parameter space. The experimental design was a fractional factorial with two center points, four factors, ten runs.

| Factor | Units | Low | Center | High |
| --- | --- | --- | --- | --- |
| Total Flow | scc/m | 80 | 100 | 120 |
| Ar:CHF$_3$ | | 1 | 2 | 3 |
| CF$_4$ | scc/m | 5 | 7 | 9 |
| NH$_3$ | scc/m | 5 | 7 | 9 |
| Pressure | mTorr | | 200 | |
| Power | Watts | | 700 | |
| B Field | gauss | | 25 | |
| Cathode Temp | Celsius | | −35 | |

The results are shown in the following table:

| Process # | Units | 1 | 2 | 3 | 4 | 5 | 6 | 7 | 8 | 9 | 10 |
| --- | --- | --- | --- | --- | --- | --- | --- | --- | --- | --- | --- |
| CHF$_3$ | sccm | 35 | 53 | 17 | 28 | 31 | 53 | 17 | 27 | 29 | 29 |
| Ar | sccm | 35 | 53 | 50 | 83 | 31 | 53 | 59 | 80 | 57 | 57 |
| CF$_4$ | sccm | 5 | 5 | 5 | 5 | 9 | 9 | 9 | 9 | 7 | 7 |
| NH$_3$ | sccm | 5 | 9 | 9 | 5 | 9 | 5 | 5 | 9 | 7 | 7 |
| Pressure | mTorr | 200 | 200 | 200 | 200 | 200 | 200 | 200 | 200 | 200 | 200 |
| Power | Watts | 700 | 700 | 700 | 700 | 700 | 700 | 700 | 700 | 700 | 700 |
| B Field | gauss | 25 | 25 | 25 | 25 | 25 | 25 | 25 | 25 | 25 | 25 |
| Temperature | °C. | −35 | −35 | −35 | −35 | −35 | −35 | −35 | −35 | −35 | −35 |
| Ox Time | sec. | 60 | 60 | 60 | 60 | 60 | 60 | 60 | 60 | 60 | 60 |
| Poly Time | sec. | 180 | 180 | 180 | 180 | 180 | 180 | 180 | 180 | 180 | 180 |
| Thermal Oxide | Å/min. | 4077 | 6838 | 7258 | 4677 | 5415 | 4000 | 4208 | 5736 | 4764 | 4649 |
| Oxide Uniformity | max./min. 2 × mean | 5.8 | 4.4 | 4.8 | 4.7 | 5.5 | 5.6 | 5.9 | 6.9 | 4 | 4.9 |
| Polysilicon | Å/min. | 215 | 41 | 3300 | 172 | 214 | 172 | 417 | 223 | 218 | 204 |
| HAR TEOS | Å/min. | 4800 | 6400 | 6900 | 5000 | 6000 | 4600 | 4900 | 6300 | 5500 | 5500 |
| HAR/T.Ox | ratio | 1.18 | 0.94 | 0.95 | 1.17 | 1.11 | 1.15 | 1.16 | 1.10 | 1.15 | 1.18 |
| Etch Time | sec. | 324 | 196 | 182 | 282 | 244 | 330 | 314 | 230 | 280 | 280 |
| 1.0 Micron Depth | micron | 2.60 | 2.10 | 2.10 | 2.32 | 2.42 | 2.52 | 2.55 | 2.40 | 2.55 | 2.60 |
| Selectivity | oxide/poly | 22.3 | 156.1 | 2.1 | 29.1 | 28.0 | 26.7 | 11.8 | 28.3 | 25.2 | 27.0 |
| RIE Lag | (%) (0.5/1.0) | 21 | 18 | 12 | 18 | 13 | 21 | 16 | 14 | 15 | 13 |
| Profile Angle | (°, 1.0) | 78 | 82 | 89 | 81 | 82 | 79 | 81 | 86 | 84 | 84 |

In the parameter space studied, higher NH$_3$ flow improves oxide etch rate, selectivity, RIE lag and profile angle. Some further checks were made to confirm the trends observed, with the results shown in the following table.

| Process | units | 1 | 2 | 3 | 4 |
| --- | --- | --- | --- | --- | --- |
| CHF$_3$ | scc/m | 20 | 20 | 30 | 30 |
| Ar | scc/m | 45 | 45 | 60 | 60 |
| CF$_4$ | scc/m | 7 | 9 | 9 | 7 |
| NH$_3$ | scc/m | 7 | 9 | 9 | 7 |
| Pressure | mTorr | 200 | 200 | 200 | 200 |
| Power | Watts | 600 | 600 | 600 | 600 |
| B Field | gauss | 25 | 25 | 25 | 25 |
| Cathode Temp | °C. | −35 | −35 | −35 | −35 |
| Oxide Etch Rate | Å/min | 6000 | 6300 | 6300 | 5500 |
| Profile | | 85 | 85 | 85 | 83 |
| Lag (0.5 μm/1.0 μm) | | ~13% | <13% | ~12% | <17% - @ 2 μm Depth |

EXAMPLE 5

Process #1 in the above table was run again to check the selectivity to silicon at the bottom of a contact. The aspect ratio of 0.5 μm contacts is 6.4. About 1200 Å of silicon has been etched in a trench during approximately 270 seconds, giving a rate of about 260 Å/min. and a selectivity of about 22:1.

Substitution of 10 volume percent hydrogen in helium or argon, or methane, in the procedures of the above examples in equivalent amounts will give similar advantageous results.

It should further be apparent to those skilled in the art that various changes in form and details of the invention as shown and described may be made. It is intended that such changes be included within the spirit and scope of the claims appended hereto.

What is claimed is:

1. A reactive ion etch process, which comprises positioning a structure comprising at least one of a dielectric layer and a semiconductor layer on a surface of a substrate in a closed chamber, supplying a selected reactive gas mixture including a gaseous source of hydrogen radicals to the chamber, applying RF energy to the chamber to establish an etching plasma and an associated electric field substyantially perpendicular to the surface of the substrate, applying a magnetic field to the chamber substantially perpendicular to the electric field and parallel to the surface of the substrate, and allowing the reactive gas mixture to etch at least a portion of the dielectric or semiconductor layer.

2. The reactive ion etch process of claim 1 additionally comprising the steps of applying a masking layer to the dielectric or semiconductor layer and forming at least one opening in the masking layer to expose the dielectric or semiconductor layer in the at least one opening.

3. The reactive ion etch process of claim 1 in which the gaseous source of hydrogen radicals comprises hydrogen, ammonia or methane.

4. The reactive ion etch process of claim 3 in which the gaseous source of hydrogen radicals comprises ammonia.

5. The reactive ion etch process of claim 4 in which the reactive gas mixture contains from about 5 to about 20 percent by volume of ammonia.

6. The reactive ion etch process of claim 5 in which the reactive gas mixture contains about 10 percent by volume ammonia.

7. The reactive ion etch process of claim 4 in which the reactive gas mixture additionally comprises CHF$_3$ and argon.

8. The reactive ion etch process of claim 7 in which the reactive gas mixture additionally comprises CF$_4$ or C$_2$F$_6$.

9. The reactive ion etch process of claim 1 in which the dielectric layer is a silicon oxide layer.

10. The reactive ion etch process of claim 1 in which the semiconductor layer is a silicon layer.

11. The reactive ion etch process of claim 1 in which the substrate is positioned at a cathode of the chamber, the process additionally comprising the step of establishing a temperature between about −40 degrees Centigrade and about 20 degrees Centigrade at the cathode prior to allowing the reactive gas mixture to etch at least a portion of the dielectric or semiconductor layer.

12. The reactive ion etch process of claim 11 in which a temperature between about 0 degrees Centigrade and about 20 degrees Centigrade is established.

13. In a magnetically enhanced reactive ion etch process for etching a dielectric or a semiconductor, the improvement which comprises adding a gaseous source of hydrogen radicals to a reactive gas mixture in an amount sufficient to increase at least one of etch rate and selectivity of the reactive gas mixture for the dielectric or the semiconductor.

14. The reactive ion etch process of claim 13 additionally comprising the steps of applying a masking layer to the dielectric or semiconductor layer and forming at least one opening in the masking layer to expose the dielectric or semiconductor layer in the at least one opening.

15. The reactive ion etch process of claim 13 in which the gaseous source of hydrogen radicals comprises hydrogen, ammonia or methane.

16. The reactive ion etch process of claim 15 in which the gaseous source of hydrogen radicals comprises ammonia.

17. The reactive ion etch process of claim 16 in which the reactive gas mixture contains from about 5 to about 20 percent by volume of ammonia.

18. The reactive ion etch process of claim 17 in which the reactive gas mixture contains about 10 percent by volume ammonia.

19. The reactive ion etch process of claim 16 in which the reactive gas mixture additionally comprises $CHF_3$ and argon.

20. The reactive ion etch process of claim 19 in which the reactive gas mixture additionally comprises $CF_4$ or $C_2F_6$.

21. The reactive ion etch process of claim 13 in which the dielectric layer is a silicon oxide layer.

22. The reactive ion etch process of claim 13 in which the semiconductor layer is a silicon layer.

23. The reactive ion etch process of claim 13 in which the substrate is positioned at a cathode of the chamber, the process additionally comprising the step of establishing a temperature between about −40 degrees Centigrade and about 20 degrees Centigrade at the cathode prior to allowing the reactive gas mixture to etch at least a portion of the dielectric or semiconductor layer.

24. The reactive ion etch process of claim 23 in which a temperature between about 0 degrees Centigrade and about 20 degrees Centigrade is established.

25. The reactive ion etch process of claim 1 in which the magnetic field is a DC magnetic field.

26. The reactive ion etch process of claim 1 in which the magnetic field is independently controllable in direction and magnitude.

27. The reactive ion etch process of claim 13 in which the reactive ion etch process is magnetically enhanced by applying the magnetic field to the dielectric or semiconductor perpendicular to an electric field used to establish a plasma and parallel to a surface of the dielectric or the semiconductor.

28. The reactive ion etch process of claim 26 in which the magnetic field is a DC magnetic field.

29. The reactive ion etch process of claim 13 in which the magnetic field is independently controllable in direction and magnitude.

* * * * *